(12) United States Patent
Kozicki

(10) Patent No.: US 7,227,169 B2
(45) Date of Patent: Jun. 5, 2007

(54) PROGRAMMABLE SURFACE CONTROL DEVICES AND METHOD OF MAKING SAME

(75) Inventor: Michael N. Kozicki, Phoenix, AZ (US)

(73) Assignee: Arizona Board of Regents, Tempe, AZ (US)

( * ) Notice: Subject to any disclaimer, the term of this patent is extended or adjusted under 35 U.S.C. 154(b) by 447 days.

(21) Appl. No.: 10/282,923

(22) Filed: Oct. 28, 2002

(65) Prior Publication Data

US 2003/0168651 A1    Sep. 11, 2003

Related U.S. Application Data

(60) Provisional application No. 60/339,604, filed on Oct. 26, 2001.

(51) Int. Cl.
*H01L 47/00* (2006.01)

(52) U.S. Cl. ............... 257/2; 257/1; 257/3; 257/4; 257/5; 257/528; 257/529; 257/530; 257/296; 365/148; 365/182; 365/107; 365/225

(58) Field of Classification Search ............ 257/2, 257/3; 365/153, 127, 100, 182, 107, 91
See application file for complete search history.

(56) References Cited

U.S. PATENT DOCUMENTS

| | | | | |
|---|---|---|---|---|
| 4,915,814 A | * | 4/1990 | Harada et al. ............... 204/425 |
| 5,215,645 A | * | 6/1993 | DiFranco et al. ............ 205/77 |
| 5,761,115 A | * | 6/1998 | Kozicki et al. ............. 365/182 |
| 5,896,312 A | * | 4/1999 | Kozicki et al. ............. 365/153 |
| 5,914,893 A | * | 6/1999 | Kozicki et al. ............. 365/107 |
| 5,961,806 A | * | 10/1999 | Tatsuura et al. ............ 205/127 |
| 5,992,820 A | | 11/1999 | Fare et al. |
| 6,084,796 A | * | 7/2000 | Kozicki et al. ............. 365/153 |
| 6,290,859 B1 | | 9/2001 | Fleming et al. |
| 6,348,365 B1 | * | 2/2002 | Moore et al. ............... 438/130 |
| 6,418,049 B1 | * | 7/2002 | Kozicki et al. ............. 365/174 |
| 6,451,487 B1 | * | 9/2002 | Besner et al. .............. 429/304 |
| 6,818,481 B2 | * | 11/2004 | Moore et al. ............... 438/130 |
| 2003/0210564 A1 | * | 11/2003 | Kozicki ........................ 365/148 |

FOREIGN PATENT DOCUMENTS

| WO | WO 95/00258 A1 | 1/1995 |
|---|---|---|
| WO | WO 97/48032 A2 | 12/1997 |
| WO | WO 99/18456 A1 | 4/1999 |
| WO | WO 99/28914 | * 6/1999 |

OTHER PUBLICATIONS

Lee J et al: "Addressable micro liquid handling by electric control of surface tension" Technical Digest MEMS 2001. 14th IEEE International Conference on Micro Electro Mechanical Systems, Interlaken, Switzerland, Jan. 21-25, 2001, pp. 499-502, XP010534657. ISBN: 0-7803-5998-4.

Welters W J J et al: "Fast electrically switchable capillary effects" LANGMUIR, vol. 14, No. 7, Mar. 31, 1998, pp. 1535-1538, XP000980065. ISSN: 0743-7463.

\* cited by examiner

*Primary Examiner*—Evan Pert
*Assistant Examiner*—Fazli Erdem
(74) *Attorney, Agent, or Firm*—Snell & Wilmer L.L.P.

(57) ABSTRACT

Programmable surface control devices whose physical features, such as surface characteristics and mass distribution, are controlled by the presence or absence of an electrodeposition of metal and/or metal ions from a solid solution upon application of a suitable electric field.

16 Claims, 4 Drawing Sheets

PROGRAMMABLE SURFACE CONTROL DEVICES AND METHOD OF MAKING SAME

CROSS-REFERENCE TO RELATED APPLICATIONS

This application claims the benefit of U.S. Provisional Application Ser. No. 60/339,604, filed Oct. 26, 2001 which is herein incorporated by reference.

FIELD OF INVENTION

The present invention generally relates to programmable surface control devices, and more particularly to programmable microelectronic surface control devices that utilize microelectronic structures in combination with an electrochemical reaction to control such devices.

BACKGROUND OF THE INVENTION

Programmable Metallization Cell (PMC) technology is generally based on the electrodeposition of metal and/or metal ions from a solid solution upon application of a suitable field. The programmable metallization cell disclosed in U.S. patent application Ser. No. 09/502,915, filed Feb. 11, 2000, which is herein incorporated by reference, is a structure that operates very effectively as a non-volatile memory device. The mechanism for the memory device utilizes a thin amorphous material with two metal contacts where the amorphous material can incorporate relatively large amounts of metal to behave as a solid electrolyte. Under certain bias conditions, the metal ions in the electrolyte are reduced to form an electrodeposit that acts as a conducting link between the metal contacts (electrodes). As a result, the resistance of the device can be greatly decreased. In addition, applying a reverse bias will cause the electrodeposit to disperse and return the device to a state of high resistance.

Formation or dissolution of an electrodeposit on a microelectronic structure or device changes the surface characteristics of the device thereby enabling one to manipulate or control the surface of the device. Moreover, since the ability to increase applications of a device depends on the ability to manipulate or control the device, there is a need for devices which already possess the ability to control surface characteristics and mass distributions of the devices by simply applying electrical means to the devices.

SUMMARY OF THE INVENTION

The present invention is directed to surface structures of microdevices whose physical and electrical features can be manipulated by applying an electrical means to the structures in order to control the surface characteristics and mass distribution of such devices. Applying an electrical means to microdevice structures having certain compositions will cause the electrodeposition or electrodissolution of an electrodeposit which can significantly alter the surface characteristics and mass distribution of the microdevice.

In accordance with one exemplary embodiment of the present invention, a programmable surface control device includes a solid electrolyte solution layer containing a conductive material, and a pair of electrodes on the surface of the electrolyte solution layer with one of the electrodes having the same type of conductive material as the electrolyte solution layer. In accordance with one aspect of this exemplary embodiment, the electrolyte solution layer is a chalcogenide glass with a dissolved metal such as silver, copper, and zinc. Exemplary chalcogenide glasses with dissolved metal in accordance with the invention include solid solutions of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, combinations of these materials, and the like. In accordance with another aspect of this embodiment, an electrodeposit is present on the surface of the solid electrolyte solution layer extending between the pair of electrodes. The electrodeposit causes the surface of the solid electrolyte solution layer to become hydrophobic and can also cause an increase in friction of the surface layer.

In accordance with another exemplary embodiment of the present invention, multiple programmable surface control devices as described above may be present on a material surface layer such as the solid electrolyte solution layer in order to control fluid distribution of small quantities of fluids on surfaces, such as the formation of droplets. The devices can be organized individually to trap single droplets or in arrays to form multiple controllable sample sites. In accordance with another aspect of the exemplary embodiment of the present invention, the programmable surface control devices may comprise various geometries and may further act as tension dams to control fluid distribution.

In accordance with still another exemplary embodiment of the present invention, a programmable surface control device like that described above is disposed in the walls of a microchannel to control fluid flow in a microfluidic system. In this exemplary embodiment, an electrodeposit is formed between the electrodes to change the contact angle of the fluid at the wall of the microchannel where an increase in the contact angle can function to restrain fluid flow. Moreover, applying a reverse bias between the electrodes will cause the electrodissolution of the electrodeposit which will decrease the contact angle of the fluid at the wall thereby increasing fluid flow.

In accordance with yet another exemplary embodiment of the present invention, a programmable surface control device like that described above may further comprise a liquid droplet to create a liquid microlens that can be used for temporary imaging and/or focusing/coupling applications. The shape and focal length of the microlens can be controlled by the formation or dissolution of an electrodeposit on the surface of the solid electrolyte solution layer which functions to change the contact angle of liquid droplets that are disposed on the solid electrolyte solution layer. Further, in one aspect of this exemplary embodiment of the device, a polymer film that does not adversely affect the desired focal length of the liquid droplets may be applied to the liquid droplets to prevent their evaporation.

In accordance with another exemplary embodiment of the present invention, a programmable surface control device like that described above may be used to control the friction of sliding surfaces that are used to move components of microelectromechanical systems (MEMS). In one aspect of this exemplary embodiment, an electrodeposit formed between the electrodes on the solid electrolyte solution layer may increase the frictional and stictional focus of the surface of the solid electrolyte solution layer. Further, in another aspect of this exemplary embodiment, the programmable surface control device may provide a continually renewable metallized surface by applying a sufficient bias between electrodes where a part of a MEMS device, such as a mechanical oscillator, for example, wears down an electrodeposit or metallized surface. The programmable surface control device of this exemplary embodiment may also be used to provide a renewable metallized surface in MEMS which include electric relays or any other functions which are capable of wearing down a metallized surface.

The present invention is also directed to a method for making a programmable surface control device which includes the steps of forming a solid electrolyte solution layer containing a conductive material and forming a pair of electrodes on the surface of the solid electrolyte solution layer where one electrode includes the same type of conductive material as the solid electrolyte solution layer. The programmable surface control device is controlled by applying a voltage between the pair of electrodes to create or dissolve an electrodeposit which, as a result, changes the surface characteristics and mass distributions of the device. In one aspect of this exemplary method of the invention, an electrodeposit is created which alters the surface tension of the solid electrolyte solution layer thereby increasing the contact angle of the electrodeposit with the solution layer and making the solution layer more hydrophobic. In another aspect of this exemplary method, the electrodeposit increases the friction of the surface of the solid electrolyte solution layer. In yet another aspect of this exemplary method, multiple programmable surface control devices are formed on a material surface and electrical means are used to control the distribution of liquid on the material surface.

In another exemplary embodiment of the present invention, a method for controlling a microfluidic system is presented which includes forming the programmable surface control device as described above in the walls of a microchannel.

A method for creating a liquid microlens is also contemplated by the present invention and includes the step of disposing a liquid droplet on the surface of the solid electrolyte solution layer formed in accordance with the method for making a programmable surface control device described above. The shape and focal length of the microlens is controlled by creating an electrodeposit on the solid electrolyte solution layer with voltage applied to the electrodes.

Still other methods of the present invention include a method for controlling components of MEMS devices by making programmably controlled surfaces on which to operate the components and a method for providing a continually renewable metallized surface using the programmable surface control device of the present invention.

BRIEF DESCRIPTION OF THE DRAWINGS

A more complete understanding of the present invention may be derived by referring to the detailed description and claims, considered in connection with the figures, wherein like reference numerals refer to similar elements throughout the figures, and:

DETAILED DESCRIPTION

The present invention generally relates to PMC technology which is based on the electrodeposition of metal and/or metal ions from a solid solution upon application of a suitable electric field. More specifically, the present invention relates to programmable surface control devices whose physical features, such as surface characteristics and mass distribution, are controlled by the presence or absence of a metallic electrodeposit upon application of a bias.

Figure 1:
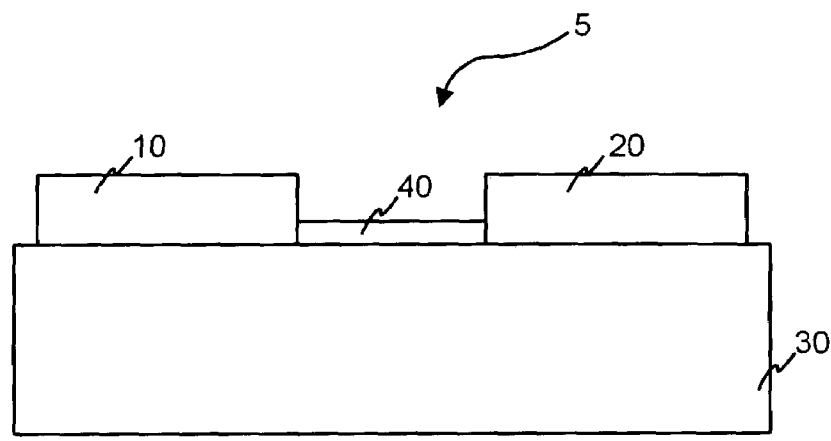
FIG. 1 is a cross-sectional illustration of an exemplary embodiment of a programmable surface control device in accordance with the present invention.

FIG. 1 illustrates a cross-sectional view of an exemplary embodiment of a programmable surface control device 5 in accordance with the present invention. Device 5 includes electrodes 10 and 20 formed on a surface of a layer of a solid electrolyte solution 30. Solid electrolyte solution layer 30 is formed from a material that conducts ions upon application of a sufficient voltage. Suitable materials for solid electrolyte solution layer 30 include chalcogenide glasses with dissolved conductive materials, such as dissolved metals and/or metal ions. The concentration of the metal in the chalcogenide glasses is typically on the order of many tens of atomic percent. In accordance with the present invention, exemplary chalcogenide glasses with dissolved metal include solid solutions of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, other chalcogenide materials which include silver, copper, or zinc, combinations of these materials, and the like.

Electrodes 10 and 20 include an anode having an oxidizable form of the metal dissolved in the chalcogenide glass and an inert cathode. When a voltage is applied between electrodes 10 and 20, the positively charged metal ions will migrate toward the cathode region. Once a sufficient bias is applied, the metal ions will form a stable metallic electrodeposit 40 that may extend across the surface of the solid electrolyte solution layer 30 from the cathode to the anode. The magnitude of the sufficiently bias will depend upon the materials used, the series resistances involved, and the geometry of the device. The applied bias is typically within a range of about 200 mV to 20V, but it will be appreciated by those skilled in the art that any bias suitable for forming stable metallic electrodeposit 40 may be used. The morphology of the resulting metallic electrodeposit will depend, in part, on the applied bias and on the total charge of the metal ions that are deposited.

Metallic electrodeposit 40 can significantly alter the surface characteristics and mass distribution of programmable surface control device 5. In one exemplary embodiment of the present invention, electrodeposit 40 may increase the contact angle of the surface of solid electrolyte solution layer 30 thereby resulting in a more hydrophobic surface. For example, silver electrodeposition on the surface of a programmable surface control device in which silver is dissolved in a germanium selenide glass may alter the surface tension of the surface of the glass so that the contact angle may increase by 30 degrees or more, making the surface of the glass significantly more hydrophobic. In another exemplary embodiment of the present invention, the presence of the electrodeposit may increase the friction of the surface of the glass. Reversing the applied bias will cause the electrodissolution of the electrodeposit, thereby returning the programmable surface control device to its original surface state. In a further exemplary embodiment of the present invention, metal ions can be manipulated towards either the cathode or the anode by supplying a sufficient bias to the programmable surface control device. Accordingly, mass distribution within the programmable surface control device can be controlled.

Programmable surface control technology may be utilized in a variety of applications that may benefit from the electromanipulation of the surface tension, surface friction, and mass distribution of programmable surface control devices.

1. Droplet Control and Microdams

A variety of applications such as immunoassay array applications, other forms of small sample chemical analyses applications, and even various printing applications, for example, require the control of small quantities of liquids, typically in the form of droplets on surfaces. Since the metallic electrodeposit of a programmable surface control device may be used to control surface tension, and therefore surface wetting, of the surface of a solid electrolyte solution layer of the programmable surface control device, it is possible to control liquid distribution on a surface that contains an arrangement of such devices using electrical means. The programmable surface control devices could be organized individually on a hydrophobic surface for the selective trapping of single droplets or in arrays to form multiple controllable sample sites. In the case where multiple controllable sample sites are formed, the sites where the electrodeposit is present would have a weaker hold on the sample liquid than those sites without the electrodeposit thereby allowing the droplets to be preferentially held at the latter sites.

Programmable surface control devices may comprise a variety of configurations, including dots, elongated structures, or other complex two-dimensional shapes. Moreover, various geometries can be used to act as surface tension dams to control fluid distribution on a hydrophilic surface. In this case, the growth of the electrodeposit, which results in a relatively hydrophobic surface, could be used to confine or exclude liquid from a region of the surface.

Figure 2:
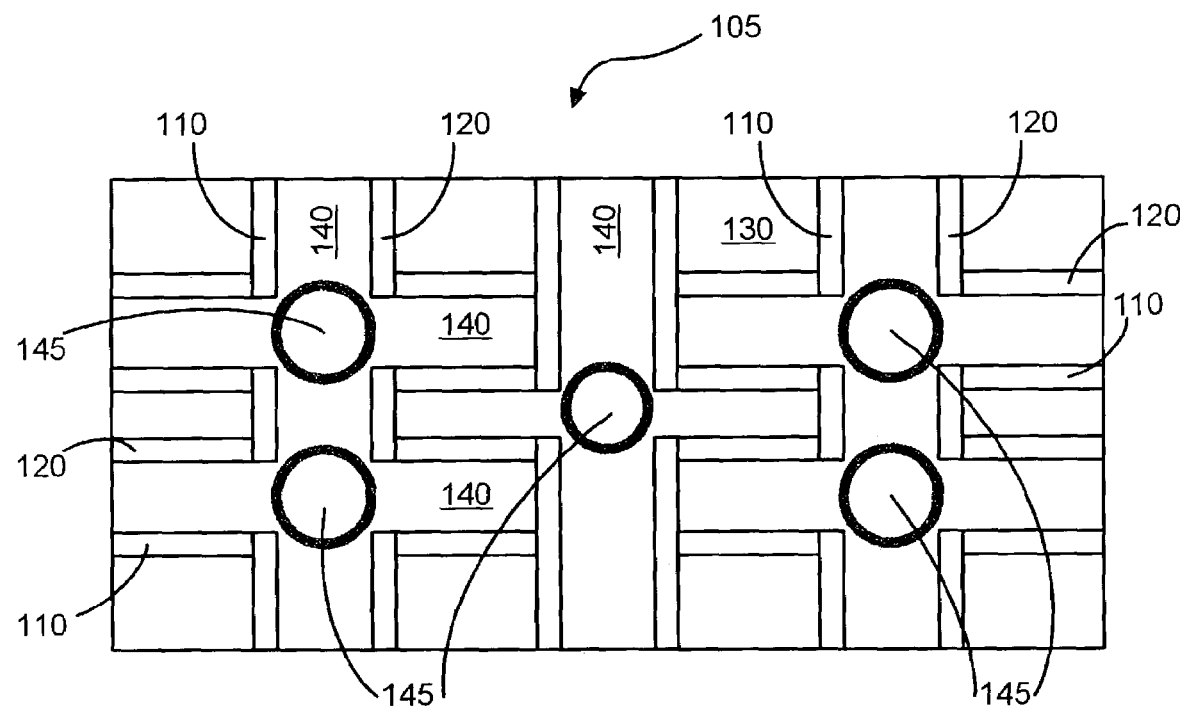
FIG. 2 is a top plan view of a device with a surface having multiple controllable sample sites in accordance with another exemplary embodiment of the present invention.

A top plan view of a device 105 with a surface 130 having multiple controllable sample sites in accordance with another exemplary embodiment of the present invention is shown in FIG. 2. Electrodes 110 and 120 are formed on surface 130 which comprises a chalcogenide glass with a dissolved metal. One of electrodes 110 and 120 comprises an anode having an oxidizable form of the same metal that is dissolved in the chalcogenide glass and the other electrode comprises an inert cathode. When a voltage is applied to electrodes 110 and 120, an electrodeposit 140 is formed on surface 130 between electrodes 110 and 120 thereby creating a hydrophobic surface which can be used to confine sample liquid to sample sites 145.

2. Microvalves

Microfluidic systems are systems in which fluids are made to flow by capillary action in micro-scale channels and are typically used in biochemical analyses applications. Programmable surface control devices like those of the present invention may be used to control the fluid flow in such microfluidic systems.

Figure 3:
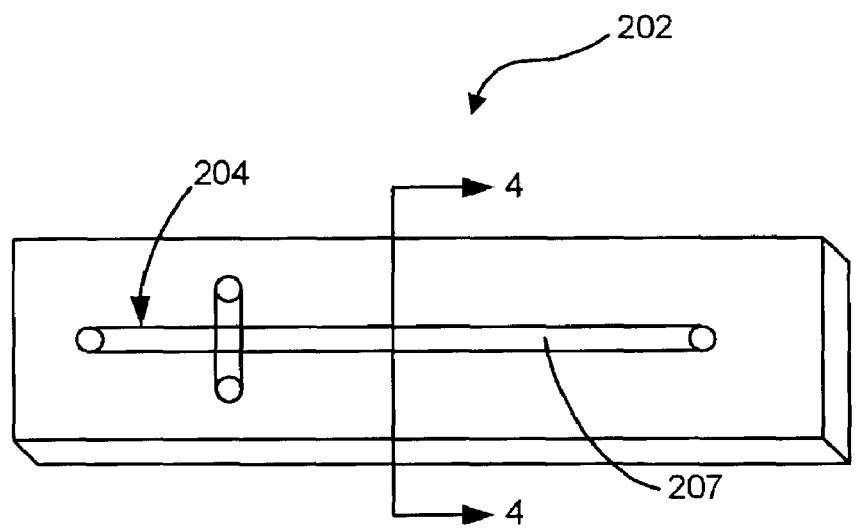
FIG. 3 is a perspective view of a microfluidic chip having a programmable microfluidic system in accordance with another exemplary embodiment of the present invention.
Figure 4:
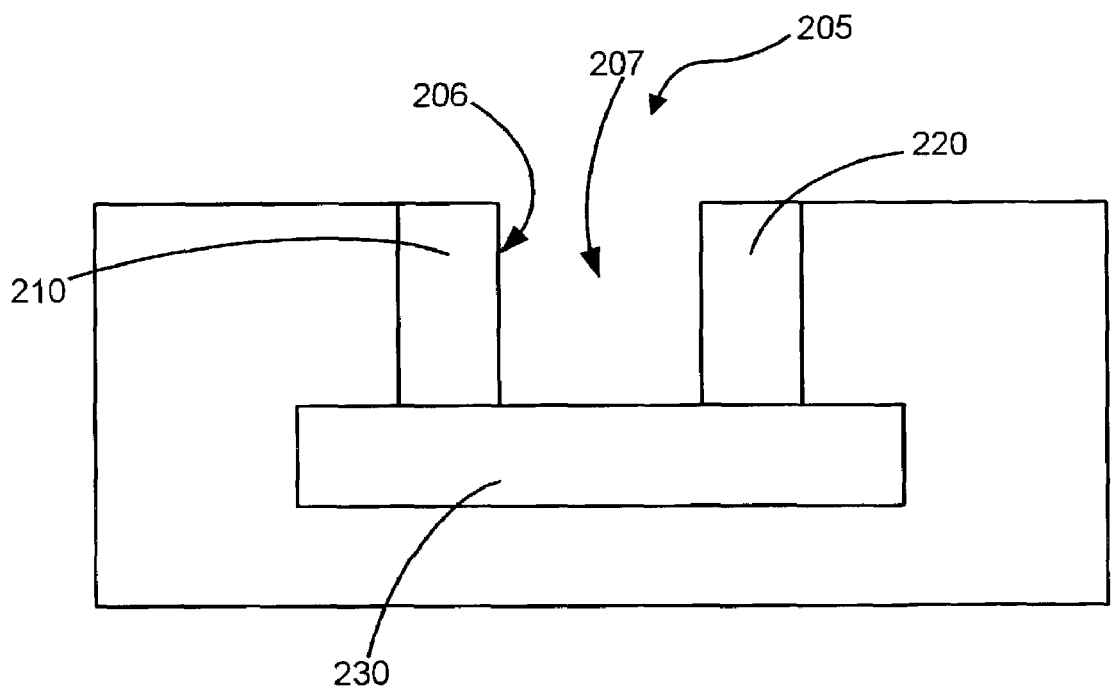
FIG. 4 is a cross-sectional view taken along line 4—4 of FIG. 3.

FIG. 3 is a perspective view of a microfluidic chip 202 having a programmable microfluidic system 204 in accordance with another exemplary embodiment of the present invention. In this exemplary embodiment, a programmable surface control device 205 as previously described with reference to FIG. 1 is disposed within the walls 206 of a microchannel 207 comprising part of the microfluidic system 204 as shown in FIG. 4. FIG. 4 is a cross-sectional view taken along lines 4—4 of FIG. 3. Device 205 includes a pair of electrodes 210 and 220 formed on a solid electrolyte solution layer 230.

Figure 5:
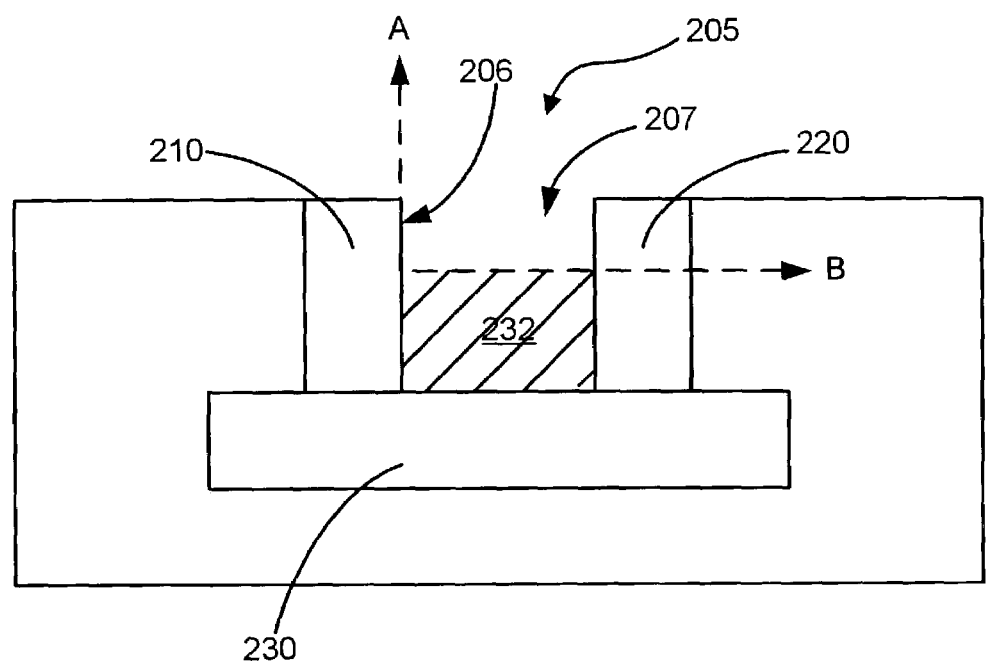
FIG. 5 is the cross-sectional view shown in FIG. 4 showing a fluid contained in the microchannel.
Figure 6:
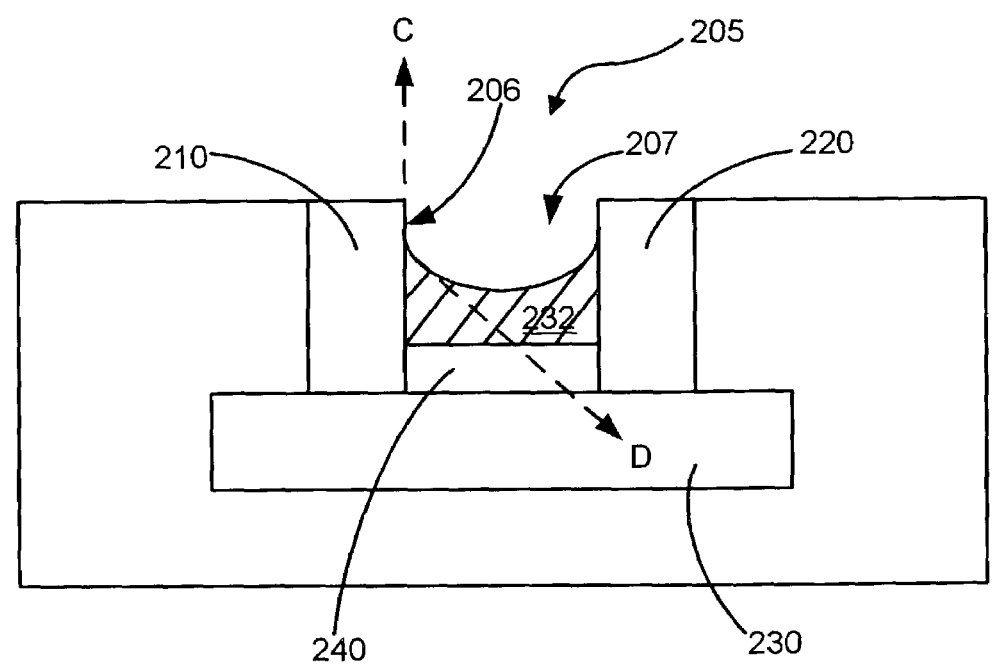
FIG. 6 is the cross-sectional view shown in FIG. 5 with a voltage applied across the electrodes contained in the walls of the microchannel.

FIG. 5 illustrates the cross-sectional view of FIG. 4 with a fluid 232 contained within microchannel 207. When no voltage is applied to electrodes 210 and 220, a surface of fluid 232 forms about a ninety degree contact angle with respect to wall 206 of microchannel 207 as shown by angle AB. However, when voltage is applied to electrodes 210 and 220, an electrodeposit 240 is formed on a surface of layer 230 as shown in FIG. 6 thereby making the surface of layer 230 more hydrophobic. Making the surface of layer 230 more hydrophobic results in increasing the contact angle of fluid 232 with wall 206 of microchannel 207 as shown by angle CD. Even a minimal contact angle increase can be sufficient to stem or retrain the flow of fluid 232 through microchannel 207.

Accordingly, disposing a programmable surface control device in accordance with the present invention within the walls of a microchannel can function to control fluid flow within the microchannel and, as a result, fluid flow within a microfluidic system that includes the microchannel. In one exemplary embodiment of the invention, the formation of a silver electrodeposit on a germanium selenide-silver glass may produce a contact angle change that is typically larger than 10 degrees thereby producing a microchannel liquid valving effect.

3. Microlens Control

Programmable surface control devices of the present invention may also be used to create a liquid microlens. Liquid droplets can function as excellent natural lenses and can be used for a wide variety of temporary imaging and/or focusing/coupling applications. The shape of a liquid microlens is typically determined by the liquid used and the hydrophobicity of the surface upon which the liquid is disposed. Since the presence of an electrodeposit at the surface of a solid electrolyte solution layer of a programmable surface control device can significantly change the contact angle of liquid droplets disposed on the surface, the shape of the liquid droplets can be manipulated by the presence of the electrodeposit. Therefore, since the hydrophobicity of the surface of the programmable surface control device can be altered electrically, a liquid microlens with an electrically controllable shape and focal length can be created.

Figure 7:
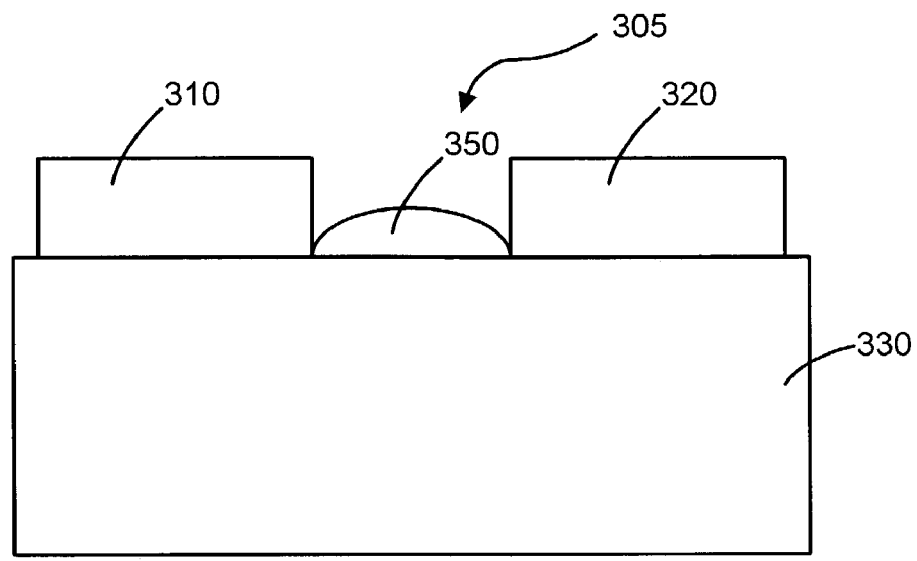
FIG. 7 is a cross-sectional view of a programmable surface control device in accordance with another exemplary embodiment of the device.
Figure 8:
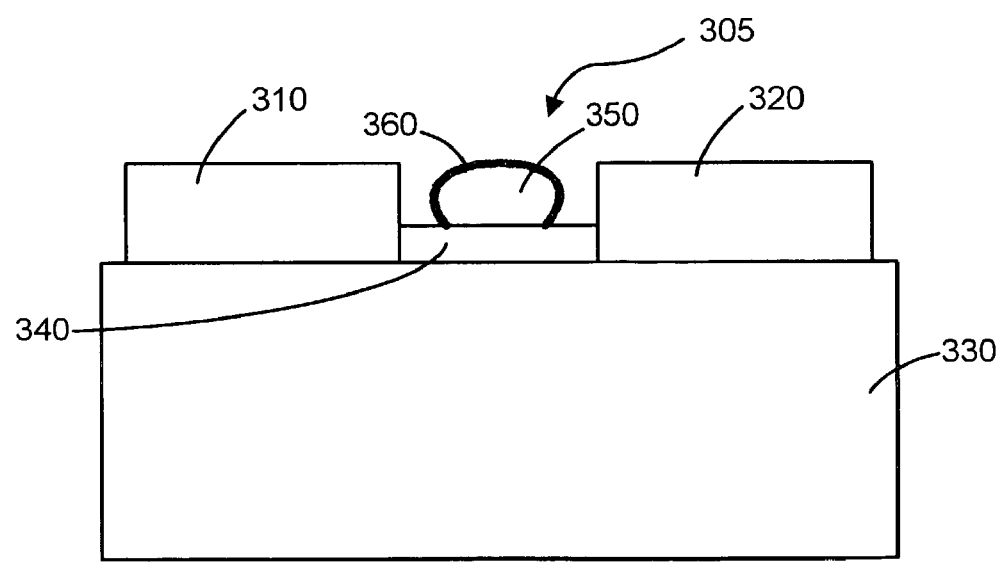
FIG. 8 is a cross-sectional view of the programmable surface control device shown in FIG. 7 with a voltage applied across the electrodes of the device.

An exemplary embodiment of such a device 305 is shown in FIGS. 7 and 8. Device 305 includes a pair of electrodes 310 and 320 formed on a surface of a solid electrolyte solution layer 330 which may comprise a chalcogenide glass containing a dissolved metal. A liquid droplet 350 is disposed on the surface of layer 330 of device 305. By applying a voltage to electrodes 310 and 320 of device 305, the shape of liquid droplet 350 can be manipulated to provide a desired shape and focal length as shown in FIG. 8. When voltage is applied to electrodes 310 and 320 and a sufficient bias is achieved, an electrodeposit 340 is formed across the surface of layer 330 between electrodes 310 and 320. Electrodeposit 340 makes the surface of layer 330 more hydrophobic thereby altering the shape and focal length of liquid droplet 350.

The shape and focal length of liquid droplets can be manipulated to provide a desired shape and focal length by applying voltage to the electrodes of the programmable surface control device. Moreover, a polymer film 360 that does not adversely effect the desired focal length of the liquid droplets can be applied to the liquid droplets to prevent their evaporation.

4. Friction Control

A variety of MEMS have parts that move in a near vacuum or in a damping fluid. However, a growing number of MEMS components are configured to operate using sliding surfaces. The programmable surface control devices of the present invention may be used to control the friction of such sliding surfaces. For example, silver electrodeposition on the surface of a programmable surface control device in which silver is dissolved in a germanium selenide glass may increase the frictional and stictional focus of the surface of the glass.

In addition, the programmable surface control device of the present invention may be used to provide a continually renewable metallized surface. For example, referring back to FIG. 1, as electrodeposit 40 is subjected to frictional forces from a part of a MEMS device, such as a mechanical oscillator (not shown) which oscillates against electrodeposit 40 between electrodes 10 and 20, metal ions from the anode and the solid electrolyte solution will migrate toward the cathode, effectively renewing the electrodeposit 40 and compensating for wear of electrodeposit 40. The programmable surface control device may also be used to provide a renewable metallized surface in a variety of other applications such as, for example, in electric relays and the like.

Although the present invention is set forth herein in the context of the appended drawing figures, it should be appreciated that the invention is not limited to the specific form shown. For example, while the programmable surface control structure is conveniently described above in connection with controlling microfluids and the friction of recurrently used surfaces, the invention is not so limited. For example, the structure of the present invention may be suitably employed as a programmable memory device or as programmable active or passive devices within a microelectronic circuit. Various other modifications, variations, and enhancements in the design and arrangement of the method and devices set forth herein may be made without departing from the present invention as set forth in the appended claims.

I claim:

1. A programmable surface control device comprising:
   a solid electrolyte solution layer comprising chalcogenide glass and a metal selected from the group consisting of silver, copper, and zinc; and
   a pair of electrodes positioned on a surface of said solid electrolyte solution layer wherein said pair of electrodes include an anode having an oxidizable form of said metal and an inert cathode, wherein the solid electrolyte solution and the electrodes are configured to alter a surface property of the device selected from the group consisting of surface tension, hydrophobicity, and surface friction.

2. The programmable surface control device of claim 1, wherein said chalcogenide glass is selected from the group consisting of $As_xS_{1-x}$, $Ge_xS_{1-x}$ and $Ge_xSe_{1-x}$.

3. The programmable surface control device of claim 1, further comprising an electrodeposit on a surface of said solid electrolyte solution layer extending between said pair of electrodes.

4. The programmable surface control device of claim 3, wherein said electrodeposit causes a surface of said solid electrolyte solution layer to be hydrophobic.

5. The programmable surface control device of claim 3, wherein said electrodeposit causes an increase in friction of a surface of said solid electrolyte solution layer.

6. A material surface comprising a plurality of programmable surface control devices as defined in claim 1, wherein said material surface comprises said solid electrolyte solution layer.

7. The material surface of claim 6, wherein at least one of said programmable surface control devices further comprises an electrodeposit.

8. The material surface of claim 6, wherein said material surface is a hydrophobic surface and said programmable surface control devices are organized individually on said hydrophobic surface.

9. The material surface of claim 6, wherein said material surface is a hydrophobic surface and said programmable surface control devices are organized in arrays.

10. The programmable surface control device of claim 1, wherein said device is disposed in walls of a microchannel.

11. The programmable surface control device of claim 10 further comprising an electrodeposit which changes a contact angle at a wall of said microchannel thereby creating a liquid valving effect.

12. The programmable surface control device of claim 1 further comprising a liquid droplet disposed on the surface of said solid electrolyte solution layer.

13. The programmable surface control device of claim 12, wherein said liquid droplet comprises a water droplet and said solid electrolyte solution layer comprises a chalcogenide glass with a dissolved metal.

14. The programmable surface control device of claim 13 further comprising an electrodeposit on the surface of said solid electrolyte solution layer to shape the water droplet.

15. The programmable surface control device of claim 14 further comprising a polymer film applied to the water droplet.

16. A continually renewable metallized surface comprising:
   a solid electrolyte solution layer containing a conductive material;
   a pair of electrodes positioned on a surface of said solid electrolyte solution layer wherein one of said electrodes includes said conductive material;
   an electrodeposit on a surface of said solid electrolyte solution layer extending between said pair of electrodes; and
   a sufficient bias between said pair of electrodes to effectively renew said electrodeposit and compensate for wear of said electrodeposit.

* * * * *